US011004603B2

(12) United States Patent
Horn et al.

(10) Patent No.: US 11,004,603 B2
(45) Date of Patent: May 11, 2021

(54) VERTICAL ELECTRODE DECOUPLING/BYPASS CAPACITOR

(71) Applicant: AVX Corporation, Fountain Inn, SC (US)

(72) Inventors: Jeffrey A. Horn, Fountain Inn, SC (US); Marianne Berolini, Greenville, SC (US)

(73) Assignee: AVX Corporation, Fountain Inn, SC (US)

( * ) Notice: Subject to any disclaimer, the term of this patent is extended or adjusted under 35 U.S.C. 154(b) by 121 days.

(21) Appl. No.: 16/357,516

(22) Filed: Mar. 19, 2019

(65) Prior Publication Data

US 2019/0295771 A1   Sep. 26, 2019

Related U.S. Application Data

(60) Provisional application No. 62/645,411, filed on Mar. 20, 2018.

(51) Int. Cl.
*H01L 23/34* (2006.01)
*H01G 4/012* (2006.01)
(Continued)

(52) U.S. Cl.
CPC ............. *H01G 4/012* (2013.01); *H01G 4/232* (2013.01); *H01G 4/30* (2013.01); *H01L 23/66* (2013.01);
(Continued)

(58) Field of Classification Search
CPC . H01L 2223/6666; H01G 4/232; H01G 4/302
(Continued)

(56) References Cited

U.S. PATENT DOCUMENTS 6,816,356 B2   11/2004   Devoe et al.
7,307,829 B1   12/2007   Devoe et al.
(Continued)

FOREIGN PATENT DOCUMENTS

KR   20120056556   6/2012
KR   20130086955   8/2013

OTHER PUBLICATIONS

International Search Report and Written Opinion for PCT/US2019/022902 dated Jun. 28, 2019, 11 pages.
(Continued)

*Primary Examiner* — Nitin Parekh
(74) *Attorney, Agent, or Firm* — Dority & Manning, P.A.

(57) ABSTRACT

The invention is directed to a multilayer ceramic capacitor comprising a top surface and an opposing bottom surface and four side surfaces that extend between the top and bottom surfaces, a main body formed from a plurality of dielectric layers and a plurality of internal electrode layers alternately arranged, and external terminals electrically connected to the internal electrode layers wherein a first external terminal is disposed along the top surface and a second external terminal is disposed along the bottom surface. The internal electrode layer includes a first electrode electrically connected to the first external terminal and a second counter electrode electrically connected to the second external terminal, wherein the first electrode includes a central portion extending from the first external terminal toward the second external terminal and wherein the central portion extends 40% to less than 100% a distance from the first external terminal to the second external terminal.

23 Claims, 6 Drawing Sheets

(51) Int. Cl.
*H01G 4/232* (2006.01)
*H01L 23/66* (2006.01)
*H01G 4/30* (2006.01)
*H01L 23/00* (2006.01)

(52) U.S. Cl.
CPC ...... *H01L 24/48* (2013.01); *H01L 2223/6666* (2013.01)

(58) Field of Classification Search
USPC .......................................................... 257/724
See application file for complete search history.

(56) References Cited

U.S. PATENT DOCUMENTS

| | | | |
|---|---|---|---|
| 7,345,868 B2 | 3/2008 | Trinh | |
| 7,463,474 B2 | 12/2008 | Ritter et al. | |
| 7,633,739 B2 | 12/2009 | Devoe | |
| 7,697,262 B2 | 4/2010 | Ritter et al. | |
| 8,289,675 B2 | 10/2012 | Devoe et al. | |
| 8,315,033 B2 | 11/2012 | Takashima et al. | |
| 8,446,705 B2 | 5/2013 | Ritter et al. | |
| 8,687,346 B2 | 4/2014 | Gadkaree et al. | |
| 2004/0042156 A1* | 3/2004 | Devoe | H01G 4/38 361/321.2 |
| 2004/0066605 A1* | 4/2004 | Trinh | C23C 28/02 361/321.2 |
| 2008/0049377 A1 | 2/2008 | Sutardja | |
| 2008/0310078 A1* | 12/2008 | Lee | H01G 4/30 361/306.3 |
| 2009/0034155 A1* | 2/2009 | Devoe | H01G 4/38 361/306.3 |
| 2010/0033897 A1* | 2/2010 | Lee | H01G 4/38 361/329 |
| 2010/0095498 A1* | 4/2010 | Aoki | H01G 4/30 29/25.42 |
| 2010/0188799 A1 | 7/2010 | Galvagni et al. | |
| 2012/0134072 A1 | 5/2012 | Bae et al. | |
| 2017/0148571 A1* | 5/2017 | Akada | H01G 4/255 |
| 2018/0190431 A1* | 7/2018 | Fukunaga | H01G 4/232 |

OTHER PUBLICATIONS muRata, Murata Manufacturing Co., Ltd., "Capacitor Data Sheet: GMA05XB11A103MA01#" dated Feb. 17, 2016, 1 page.

\* cited by examiner

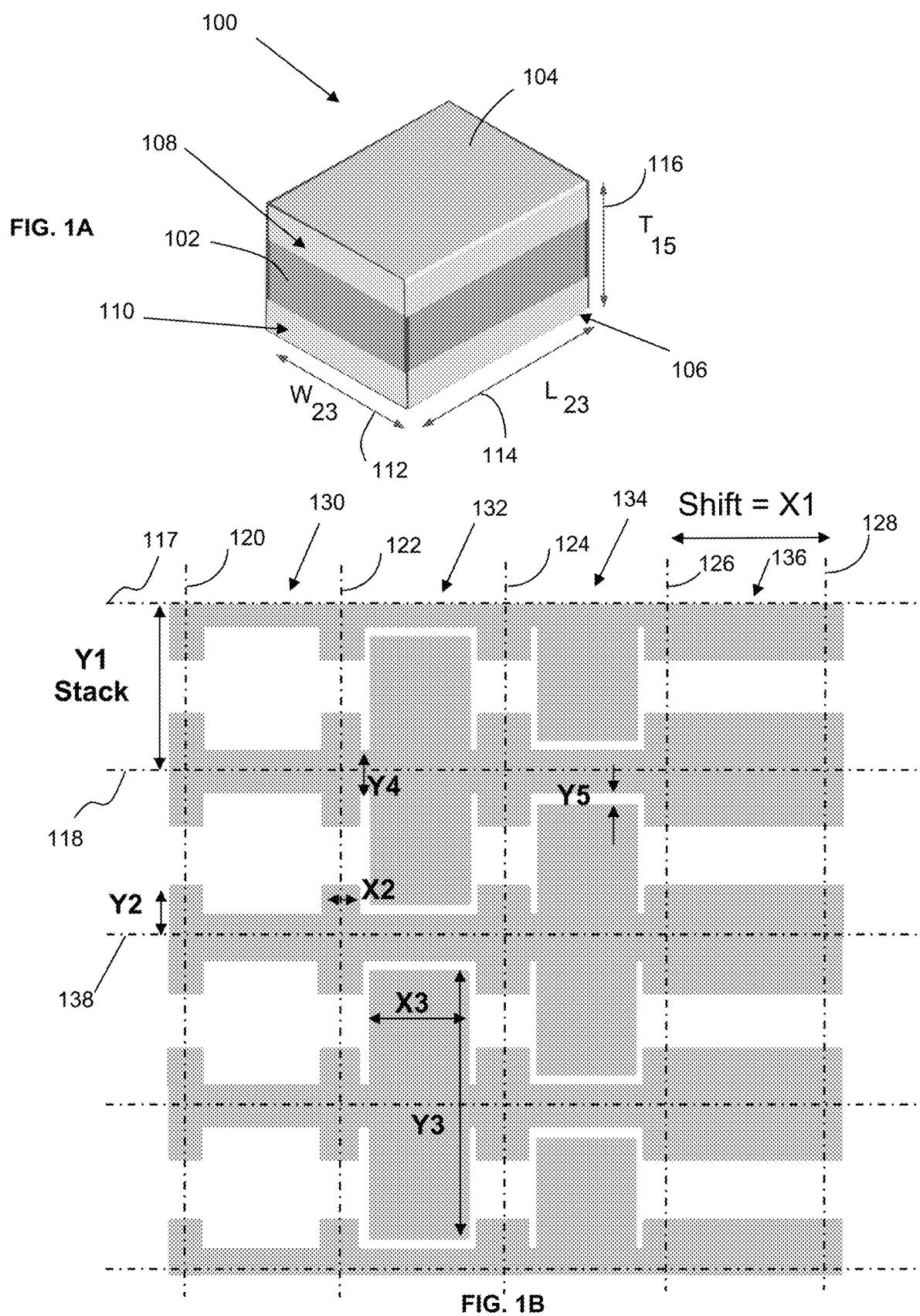

VERTICAL ELECTRODE DECOUPLING/BYPASS CAPACITOR

CROSS-REFERENCE TO RELATED APPLICATION

The present application claims filing benefit of U.S. Provisional Patent Application Ser. No. 62/645,411 having a filing date of Mar. 20, 2018, and which is incorporated herein by reference in its entirety.

BACKGROUND OF THE INVENTION

For some time, the design of various electronic components has been driven by a general industry trend toward miniaturization, as well as increased functionality. In such regard, a need exists for ever smaller electronic components having improved operating characteristics. For example, some applications would benefit from the ability to have improved operating characteristics even if existing size is maintained. One such characteristic could be CV ratings for capacitors, which generally reflect the product of the capacitance of a device and the level of voltage it can handle. Other desirable characteristics may involve stable performance over an ever-increasing broad range of frequencies.

As such rapid changes occur in the semiconductor industry requiring new performance criteria of their supporting components, one of such components is the decoupling capacitor used in almost every circuit design. As integrated circuits have become faster and denser, the application design considerations have created a need to redefine the capacitor parameters and its performance in high-speed environments. Faster edge rates, larger currents, denser boards and spiraling costs have all served to focus upon the need for better and more efficient decoupling techniques.

As well understood, a capacitor is an electrical device consisting of two metal conductors isolated by a nonconducting material capable of storing electrical charge for release at a controlled rate and at a specified time. Therefore, the functionality of its usefulness is determined by ability to store electrical energy. Capacitance measurements are in reality a combination of capacitive reactance, inductive reactance, and equivalent series resistance. Significantly, all three of such series impedances vary differently with frequency, which means in turn that capacitance calculated from resulting impedance comprises different components at different frequencies.

Increased inductance (increased lead length) actually increases measured capacitance value. One main purpose for decoupling relative to today's high-speed digital circuits is to eliminate high-speed transient noise which is above its resonance point. For such applications, it is desirable to maintain as low an inductance or total impedance as possible. This means that performance criteria of any capacitor is best defined for the circuit conditions of its intended use.

For example, decoupling requirements of dynamic RAMs involve large transients which are generated during the RAM's refresh cycle. Such large transients require careful design attention of decoupling techniques used to avoid "V bump" or "soft" error problems. Such problems comprise transient noise and reflect the supply transient induced by the chip itself on the decoupling capacitor when various clocks fire on-chip and drive on-chip capacitance associated with that event (such as address decoding). Since actual loads switched are small, size of the decoupling capacitor can be less important typically than its inductance.

When a capacitor is mounted on a board, lead lengths and board lines (device to capacitor to ground) are a major source of inductance. Minimizing such inductance contributes to good decoupling performance under high-speed transient conditions. Accordingly, efficiently accessible wire bonding features can contribute to reduced inductance which can contribute to improved broadband frequency performance of a decoupling capacitive device.

The use of bypass/decoupling methods per se to achieve signal integrity is generally known. Electrical noise can be caused in a number of different ways. In RF circuitry, oscillators and amplifier circuits generate such noise. In the digital environment, the switching integrated circuits, power supplies and regulators mainly generate such noise, often in the form of a voltage ripple. One approach to decoupling functionality, for example, in the context of a power distribution system, is to identify a target impedance to be met across a broad frequency range and specify components to meet that impedance. Such a targeted impedance ideally must be met not only at DC, but also at all frequencies where current transients exist. Thus, the broader range of frequencies to be addressed, the more problematic in providing effective decoupling solutions.

It would be advantageous, therefore, if capacitors could be provided that result in improved miniaturization, as well as increased functionality and/or operational characteristics. Additionally, a decoupling device is desired which is effective over a broad range of frequencies with minimized insertion loss while having efficient wire bonding capabilities.

SUMMARY OF THE SUBJECT MATTER

In accordance with one embodiment of the present invention, a multilayer ceramic capacitor is disclosed. The multilayer ceramic capacitor includes a top surface and an opposing bottom surface and four side surfaces that extend between the top surface and the bottom surface, a main body formed from a plurality of dielectric layers and a plurality of internal electrode layers alternately arranged, and external terminals electrically connected to the internal electrode layers wherein a first external terminal is disposed along the top surface and a second external terminal is disposed along the bottom surface. The internal electrode layer includes a first electrode electrically connected to the first external terminal and a second counter electrode electrically connected to the second external terminal, wherein the first electrode includes a central portion extending from the first external terminal toward the second external terminal and wherein the central portion extends 40% to less than 100% a distance from the first external terminal to the second external terminal.

Other features and aspects of the present invention are set forth in greater detail below.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which:

FIG. 1A illustrates a generally top and sides external perspective view of one embodiment of a capacitor in accordance with the present invention;

FIG. 1B illustrates "green" condition layers of electrodes to be formed for inclusion in the embodiment of FIG. 1A;

Figure 2A:
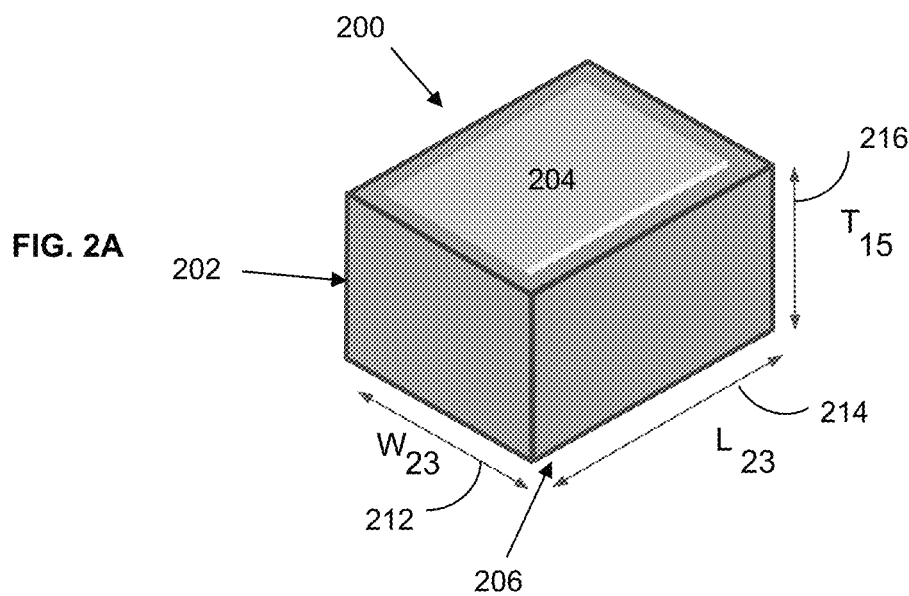
FIG. 2A illustrates a generally top and sides external perspective view of another embodiment of a capacitor in accordance with the present invention.

Repeat use of reference characters throughout the present specification and appended drawings is intended to represent same or analogous features, elements, or steps thereof.

DETAILED DESCRIPTION OF THE SUBJECT MATTER

It is to be understood by one of ordinary skill in the art that the present discussion is a description of exemplary embodiments only, and is not intended as limiting the broader aspects of the present invention.

Generally speaking, the present invention is directed to a capacitor, in particular a decoupling/bypass capacitor, containing vertical electrodes. In particular, the electrode configuration can allow for the formation of a low-profile capacitor, for instance similar to a single layer capacitor. The present inventors have discovered that the electrode configuration described herein can allow for a stable performance over a broad range of frequencies. In particular, the electrode configuration can allow for minimal insertion loss over a broad range of frequencies.

The present invention includes a multilayer ceramic capacitor that contains a plurality of capacitive elements within a single, unitary package. The capacitor includes a top surface and a bottom surface opposite the top surface. The capacitor also includes at least one side surface that extends between the top surface and the bottom surface. The capacitor may include at least four side surfaces that extend between the top surface and the bottom surface. In one embodiment, the capacitor includes at least six total surfaces (e.g., one top, one bottom, four sides). For instance, the capacitor and/or the main body of the capacitor may have a parallelepiped shape, such as a rectangular parallelepiped shape.

In general, the capacitor includes alternating dielectric layers and electrode layers, which may form at least a part of the main body of the capacitor. By arranging the dielectric layers and the electrode layers in a stacked or laminated configuration, the capacitor may be referred to as a multilayer capacitor and in particular a multilayer ceramic capacitor, for instance when the dielectric layers comprise a ceramic. In general, the stack of alternating dielectric layers and electrode layers (i.e., active electrode layers) may be referred to herein as an active electrode region.

The electrode layers include a plurality of first electrode layers and a plurality of second electrode layers. In particular, the first electrode layers and the second electrode layers are interleaved in an opposed and spaced apart relation with a dielectric layer located between each adjacent electrode layer. In this regard, the first electrode layer and the second electrode layer may be presented in a parallel relationship.

In general, the thickness of the dielectric layers and the electrode layers is not limited and can be any thickness as desired depending on the performance characteristics of the capacitor. For instance, the thickness of the electrode layers can be, but is not limited to, being about 500 nm or greater, such as about 1 µm or greater, such as about 2 µm or greater, such as about 3 µm or greater, such as about 4 µm or greater to about 10 µm or less, such as about 5 µm or less, such as about 4 µm or less, such as about 3 µm or less, such as about 2 µm or less. For instance, the electrode layers may have a thickness of from about 1 µm to about 2 µm. In addition, in one embodiment, the thickness of the dielectric layer may be defined according to the aforementioned thickness of the electrode layers. Also, it should be understood that such thicknesses of the dielectric layers may also apply to the layers between any anchor electrode layers, shield electrode layers, and/or floating electrode layers, when present and as defined herein.

Each electrode layer includes a first electrode and a second (counter) electrode. For instance, the first electrode and the second electrode may be in substantially the same plane, longitudinally and laterally. The first electrode includes a central portion or main body that extends away from an external terminal and one end of the first electrode toward the other external terminal. Such portion may extend directly from the external terminal. Alternatively, such portion may extend from a base portion of the first electrode, which along with the central portion or main body also extends from the external terminal. In general, the base portion of the first electrode extends along a longitudinal edge of the first electrode adjacent the external terminal. In addition, the central portions of the first electrodes of adjacent electrode layers at last partially overlap in a horizontal direction.

The first electrode may also include at least one electrode arm that extends away from the external terminal. The electrode arm may extend directly from the external terminal. Alternatively, the electrode arm may extend from a base portion of the first electrode, which along with the arm also extends from the external terminal. In some embodiments, at least two electrode arms may extend away from the external terminal. The electrode arms may extend directly from the external terminal. Alternatively, the electrode arms may extend from a base portion of the first electrode, which along with the arms also extends from the external terminal.

The second electrode may also include at least one electrode arm. The electrode arm may extend directly from the external terminal. When two electrode arms are present, both electrode arms may extend directly from the external terminal. Alternatively, the electrode arm may extend from a base portion of the second electrode, which along with the arm also extends from the external terminal. In some embodiments, at least two electrode arms extend from the base portion; in such embodiments, the electrode arms are adjacent each side of the central portion of the first electrode. In general, the electrode arm(s) of the second electrode are longitudinally aligned with the electrode arm(s) of the first electrode.

It should be understood that when the arms extend from the base portion, such extension is also from the external terminal; however, such extension may not necessarily be directly from the external terminal.

When employed, the electrode arm has a length in the longitudinal direction wherein the length is the distance of the arm from the longitudinal edge adjacent and connecting to the external terminal to the opposing longitudinal edge of the arm. Accordingly, the electrode arm has a length that is 5% or more, such as 10% or more, such as 20% or more, such as 25% or more, such as 30% or more the length between the external terminals in a vertical direction. The electrode arm has a length that is less than 50%, such as 40% or less, such as 30% or less, such as 20% or less he length between the external terminals in a vertical direction.

In addition, the central portion or main body of the first electrode may be of a certain length in the longitudinal direction wherein the length is the distance of the central portion or main body from the longitudinal edge adjacent and connecting to the external terminal to the opposing longitudinal edge of the central portion or main body. For instance, the electrode layer, including the first electrode and the counter electrode, extend between a first external terminal and a second external terminal. The central portion of the main electrode may extend 40% or more, such as 50% or more, such as 55% or more, such as 60% or more, such as 65% or more, such as 70% or more the distance between the first external terminal and the second external terminal (i.e., the length between the external terminals in a vertical direction). The central portion of the main electrode may extend less than 100%, such as 90% or less, such as 85% or less, such as 80% or less, such as 75% or less, such as 70% or less, such as 65% or less the distance between the first external terminal and the second external terminal.

The second (counter) electrode in each layer may extend 5% or more, such as 10% or more, such as 15% or more, such as 18% or more, such as 20% or more, such as 22% or more the distance between the first external terminal and the second external terminal. The second (counter) electrode may extend 50% or less, such as 40% or less, such as 35% or less, such as 30% or less, such as 25% or less the distance between the first external terminal and the second external terminal.

In addition, a gap may be present between the central portion or main body of the first electrode and the counter electrode within an electrode layer. Such gap may be 2% or more, such as 5% or more, such as 7% or more, such as 9% or more, such as 10% or more, such as 12% or more the distance between the first external terminal and the second external terminal. Such gap may be 40% or less, such as 30% or less, such as 25% or less, such as 20% or less, such as 15% or less, such as 13% or less, such as 11% or less the distance between the first external terminal and the second external terminal.

The gap may be 5% or more, such as 7% or more, such as 10% or more, such as 13% or more, such as 15% or more, such as 18% or more, such as 20% or more the length of the central portion of the first electrode. The gap may be 40% or less, such as 35% or less, such as 30% or less, such as 25% or less, such as 22% or less, such as 20% or less, such as 18% or less, such as 15% or less the length of the central portion of the first electrode.

In addition to the above, it should be understood that the capacitor of the present invention may include additional electrode layers. For instance, as generally known in the art, the capacitor of the present invention may include anchor electrode layers, shield electrode layers, floating electrode layers, or a combination thereof. In one embodiment, the capacitor includes anchor (or dummy) electrode layers. In another embodiment, the capacitor includes at least shield electrode layers. In another embodiment, the capacitor includes at least floating electrodes. In another embodiment, capacitor includes both anchor electrode layers and shield electrode layers. In another embodiment, the capacitor includes anchor electrode layers, shield electrode layers, and floating electrode layers. When present, such electrode layers are also provided in an interleaved configuration with dielectric layers. However, it should be understood that the capacitor may not include any of the aforementioned anchor electrode layers or shield electrode layers.

As indicated above, the capacitor may include anchor electrode layers. In such embodiment, an anchor electrode layer may include a third anchor electrode and a fourth anchor electrode. Such anchor electrodes may be in substantially the same plane, longitudinally and laterally. The anchor electrode layers may be employed to provide additional nucleation points and guides for external termination, for instance when plating a thin-film layer of conductive material directly to the electrode layers exposed along a surface of the main body of the capacitor. Such plating techniques, as further described herein, may be referred to as electroless and/or electrolytic plating.

In general, the positioning of such anchor electrode layers is not necessarily limited. In one embodiment, such anchor electrode layers may be provided between respective the first electrode layers and the second electrode layers. In another embodiment, such anchor electrode layers may be provided above and/or below a stack of alternating dielectric layers and internal (active or first/second) electrode layers. Such anchor electrode layers may be provided within an anchor electrode region wherein each region includes at least one anchor electrode layer. For instance, the anchor electrode layers may be provided on top of and adjacent the stacked assembly of dielectric layers and active electrode layers. The anchor electrode layers may be provided beneath and adjacent the stacked assembly of dielectric layers and electrode layers. When present, the third anchor electrode of the anchor electrode layer may contact the first external terminal while the fourth anchor electrode of the anchor electrode layer may contact the second external terminal.

In addition, the anchor electrode layers may have any configuration known in the art. For instance, the third anchor electrode and the fourth anchor electrode may have a C-shaped configuration. For instance, the anchor electrodes may have a base portion and at least one, such as two, electrode arms extending from the base portion, in particular from the lateral ends of the base portion. Such electrode arms may extend in the longitudinal direction away from an end of the capacitor body. The electrode arms of the third and fourth anchor electrodes may also be longitudinally aligned. The electrode arms may have dimensions and gaps as illustrated in the figures; such dimensions and gaps may be the same as the gaps and arms as described for the first and second electrodes of the electrode layers. In general, the anchor electrodes may have configurations that are different than the configurations of the first and second active electrode layers described above and the shield electrodes described below.

As indicated above, the capacitor may include a shield electrode layer. In such embodiment, a shield electrode layer may include a fifth shield electrode and a sixth shield electrode. Such shield electrodes may be in substantially the same plane, longitudinally and laterally. The shield electrode layer may be employed to provide additional capacitance, protection from electromagnetic interference, and/or other shielding characteristics.

In general, the positioning of such shield electrode layer is not necessarily limited. For instance, in one embodiment, the shield electrode layer may be provided above and/or below a stack of alternating dielectric layers and internal (active or first/second) electrode layers. Such shield electrode layers may be provided within a shield electrode region wherein each region includes at least one shield electrode layer. For instance, the shield electrode layers may be provided above a stacked assembly of dielectric layers and electrode layers. Alternatively, the shield electrode layers may be provided below a stacked assembly of dielectric layers and electrode layers. In another embodiment, the shield electrode layers may be provided above and below a stacked assembly of dielectric layers and electrode layers. When present, the fifth shield electrode of the shield electrode layer may contact the first external terminal while the sixth shield electrode of the shield electrode layer may contact the second external terminal.

In general, the shield electrode layers may have any configuration known in the art. For instance, the fifth shield electrode and the sixth shield electrode may have a rectangular configuration. In general, the shield electrodes may have configurations that are different than the configurations of the first and second active electrode layers described above and the anchor electrodes described above.

In addition, the shield electrode layer may include a shield layer gap between the fifth electrode and the sixth electrode. For instance, the fifth electrode may be connected to a first terminal while the sixth electrode may be connected to a second terminal. The shield layer gap may be the distance between the unconnected ends of the respective terminals in a longitudinal direction. In one embodiment, such shield layer gap may be less than an external terminal gap between the external terminals on a top surface and/or bottom surface of the capacitor. For instance, the external terminals may terminate on a top surface and or a bottom surface of the capacitor. The distance between the termination ends of the external terminals on such surface may be defined as an external terminal gap in a longitudinal direction. For instance, such length of shield layer gap in a longitudinal direction may be about 3% or more, such as about 5% or more, such as about 10% or more, such as about 15% or more, such as about 20% or more, such as about 25% or more, such as about 30% or more to less than 100%, such as about 80% or less, such as about 60% or less, such as about 40% or less, such as about 35% or less, such as about 25% or less, such as about 20% or less, such as about 15% or less, such as about 10% or less the length of the external terminal gap in a longitudinal direction.

In one embodiment, the shield electrode layer may be separated from the stacked assembly by an anchor electrode region containing at least one anchor electrode layer. In this regard, the shield electrode layer may be provided above and/or below at least one anchor electrode region. For instance, the shield electrode layer may be provided on top of and adjacent at least one anchor electrode region. The shield electrode layer may be provided immediately beneath and adjacent at least one anchor electrode region. In one embodiment, such anchor electrode regions may include a plurality of anchor electrode layers.

Additionally, the shield electrode may be buried within the capacitor. For instance, the main body of the capacitor may include a ceramic cover on a top surface and/or a bottom surface. In one embodiment, the capacitor includes a ceramic cover on both a top surface and a bottom surface. The ceramic cover may be the same material as employed for the dielectric layers. In one embodiment, however, the capacitor may include a shield electrode layer adjacent a side surface of the capacitor. Such shield electrode may assist in forming the external terminals.

As indicated above, the capacitor may include a floating electrode layer containing at least one floating electrode. In such embodiment, a floating electrode layer may include a seventh electrode. In general, such floating electrodes are not directly connected to an external terminal. However, the floating electrode may a part of a floating electrode layer containing at least one electrode that is electrically connected to an external terminal; however, such floating electrode layer contains at least one floating electrode that does not directly contact such electrode or external terminal.

The floating electrode may be positioned and configured according to any method known in the art. For instance, the floating electrode may be provided such that it overlaps at least a portion, such as a central portion, of a first electrode of a first electrode layer and/or a second electrode layer. In this regard, the floating electrode layer is layered and disposed alternately with the first electrode layers and the second internal electrode layers; in this regard, such layers may be separated by the dielectric layers.

In addition, such floating electrodes may have any shape as generally known in the art. For instance, in one embodiment, the floating electrode layers may include at least one floating electrode having a dagger like configuration. For instance, such configuration may be similar to the configuration and shape of the first electrode as described herein.

In addition, in one embodiment, the floating electrode layer may contain at least one floating electrode wherein the end of the floating electrode is adjacent at least one external terminal but does not contact such external terminal. In this regard, such gap may be referred to as a floating electrode gap in a longitudinal direction. Such floating electrode gap may be greater than 0%, such as about 3% or more, such as about 5% or more to about 50% or less, such as about 40% or less, such as about 30% or less, such as about 20% or less, such as about 10% or less the length of the capacitor in the longitudinal direction.

Additionally, the capacitor includes a first external terminal and a second external terminal. In particular, the first extremal terminal may be disposed along a top surface of the capacitor while the second external terminal may be disposed along a bottom surface of the capacitor that is opposite the top surface in the longitudinal direction. In general, the first electrodes of the first electrode layers and the second (counter) electrodes of the second electrode layers are electrically connected to a first external terminal. Meanwhile, the first electrodes of the second electrode layers and the second (counter) electrodes of the first electrode layers are electrically connected to a second external terminal.

In one embodiment, the external terminals wrap around to the side surfaces. For instance, the external terminals present on the top surface and/or bottom surface extend to all four side surfaces; however, the respective top and bottom external terminals, including the wrap around terminations, do not contact one another. In this regard, each external terminal wraps around and contacts five surfaces. In another embodiment, the external terminals present on the top surface and/or bottom surface extend to only two side surfaces; however, the respective top and bottom external terminals, including the wrap around terminations, do not contact one another. In this regard, each external terminal wraps around and contacts three surfaces. Such wrap around termination can be provided by employing various electrode configurations, including anchor electrodes and/or shield electrodes.

In one embodiment, the external terminals are present only on the top surface and the bottom surface. In this regard, such external terminals do not wrap around to any of the side surfaces. That is, each external terminal only contacts one surface.

To form the desired termination, the longitudinal edge of the first electrode and the second electrode contacting the respective external terminal may be of a certain length. For instance, in one embodiment, the longitudinal edge of the electrode may be 98% or more, such as 100% the length of the longitudinal edge (i.e., length form a side surface to an opposing side surface in which the longitudinal edge of the electrode extends) of the main body of the capacitor. Alternatively, the longitudinal edge of the electrode may be 98% or less, such as 95% or less, such as 93% or less, such as 92% or less, such as 90% or less the length of the longitudinal edge of the main body of the capacitor. In such embodiment, the longitudinal edge of the electrode may be 40% or more, such as 50% or more, such as 60% or more, such as 70% or more, such as 80% or more the length of the longitudinal edge of the main body of the capacitor.

The present invention is also directed to a method of making a capacitor. The method includes providing a plurality of first electrode layers as disclosed herein, providing a plurality of second electrode layers as disclosed herein, and interleaving a plurality of dielectric layers with alternating first electrode layers and second electrode layers to form a stacked configuration. When present, the method may also include providing at least one anchor electrode layer. Similarly, when present, the method may also include providing at least one shield electrode layer.

In addition, the method may include exposing a longitudinal edge of each base portion in the main body; such exposure may assist in forming the external terminals. Such exposure may already be present when forming the electrode layers. In addition, the electrode may be exposed on at least three surfaces; such exposure may allow for a wrap-around termination. For instance, such wrap-around termination may be present on at least three surfaces, such as at least five surfaces of the capacitor. Thus, the method may also include forming a first external terminal and a second external terminal as disclosed herein.

The capacitor of the present invention can be further described according to the embodiments as illustrated in FIGS. 1A-1B, 2A-2B, 3, 4, 5A-5E, 6A-6D and 7. As illustrated in the figures, 134 refers to a lateral direction while 132 refers to a longitudinal direction wherein the lateral direction 134 may be perpendicular to the longitudinal direction 132. Meanwhile, 136 refers to a vertical direction (i.e., a z-direction).

FIG. 1A illustrates a generally top and sides external perspective view of a first embodiment of a capacitor generally 100. As illustrated, the capacitor 100 generally has a six-sided polyhedron body generally 102, with external top and bottom terminals, respectively 104 and 106 (not seen). As shown, such external terminals are present on a designated top or bottom but also overlap or wrap around a portion of the sides between the top and bottom, such as sides 108 and 110.

The width and length dimensions 112 and 114 are marked as "23" for reference to 23 mils. As understood by those of ordinary skill in the art, certain standard shapes or package sizes are normalized in the industry. The thickness or height "T" dimension 116 of capacitor 100 is represented as "15" for reference to 15 mils. The dimensions represented by capacitor 100 of the presently disclosed subject matter in FIG. 1A would be generally referred to as an "0202", for a so-called low profile device. In particular, the package size illustrated may be representative of a size sometimes associated with a single layer capacitor (SLC). However, the presently disclosed subject matter preferably may comprise a plurality of layers of vertical electrodes, as discussed herein.

As is understood by those of ordinary skill in the art, multilayer capacitors may be formed by layers of material initially formed along films in a green state, and then cut or diced into electrode layers to be stacked in the desired multilayer configuration. FIG. 1B illustrates electrode layer patterns positioned before such cutting or dicing operation, but with various dotted lines represented such as would generate when assembled capacitor 100. In particular, such cut lines are in regular rows and columns so as to form right angles at the intersections thereof. Sets of intersecting cut lines form electrodes to be stacked for formation of the subject capacitor subject matter. For example, dotted lines 117 and 118 both respectively cooperate and interact with each of respective right-angle intersecting cut lines 120, 122, 124, 126, and 128 so as to form sectioned layers 130, 132, 134, and 136, respectively. Similarly, cut lines 118 and 138 both respectively cooperate and interact with each of the respective right-angle intersecting cut lines 120, 122, 124, 126, and 128 so as to form sectioned layers which appear in FIG. 1B below each of 130, 132, 134, and 136, respectively.

It is to be further understood that while sectioned layers 130 and 136 form in effect respective "end" layers when stacked, sectioned layers 132 and 134 comprise respective complementary electrode patterns, for forming respective portions of capacitor 100.

Also, it will be understood that various dimensions regarding such green-state sectioned layers may be selected in order to result in desired design criteria of a capacitor 100. For example, the "Shift" dimension X1 involved with printing of the green electrode layers and the "Stack" dimension Y1 involved therewith, help to define the overall dimensions of the green-state sectioned layers 130, 132, 134, and 136. As shown, the "Shift" dimension X1 equates to the distance between dotted lines 126 and 128 so as to define in one dimension the sectioned layer 136, while the "Stack" dimension Y1 equates to the distance between dotted lines 117 and 118 so as to define in the other dimension the sectioned layer 136. It is also understood by those of ordinary skill in the art that the green-state electrode layers are eventually once diced and assembled subjected to a curing or heat treatment process (such as firing), which results in well-known shrinkage of the involved materials. Different materials may have different shrinkage rates, all of which may be taken into account when selecting X1 and Y1 dimensions in order to achieve desired dimensions for capacitor 100. However, in one embodiment, X1 may be about 0.0320" and Y1 may be about 0.0230". As used herein with regards to such dimension, about may mean within 10%, such as within 5%, such as within 3%, such as within 2%.

Further, those of ordinary skill in the art understand that adjusting dimensions and positioning of the planar electrode elements in the respective sectioned layers can affect resulting characteristics of capacitor 100. For example, for such design reasons, the various other dimensions X2, X3, Y2, Y3, Y4, and Y5 may all be selected by users for particular embodiments in order to impart desired resulting characteristics of a device 100. However in one embodiment, X2 may be about 0.0110', X3 may be about 0.0150", Y2 may be about 0.0075", Y3 may be about 0.0290", Y4 may be about 0.0110", and Y5 may be about 0.0030".

FIG. 2A illustrates a generally top and sides external perspective view of another embodiment of a capacitor generally 200. As illustrated, the capacitor 200 generally has a six-sided polyhedron body generally 202, with external top and bottom terminals respectively 204 and 206 (not seen). As shown and/or discussed, such external terminals are present on a designated top or bottom but do not also overlap or wrap around a portion of the sides between the top and bottom.

The width and length dimensions 212 and 214 are marked as "23" for reference to 23 mils. The thickness or height "T" dimension 216 of capacitor 200 is represented as "15" for reference to 15 mils. Similar to those of FIG. 1A, the dimensions represented by the capacitor 200 of the presently disclosed subject matter in FIG. 2A would be generally referred to as an "0202", for a so-called low profile device. In particular, the package size illustrated may be representative of a size sometimes associated with a single layer capacitor (SLC). However, as with the embodiment of FIG. 1A, the presently disclosed subject matter of FIG. 2A preferably may comprise a plurality of layers of vertical electrodes, as further discussed herein.

Figure 2B:
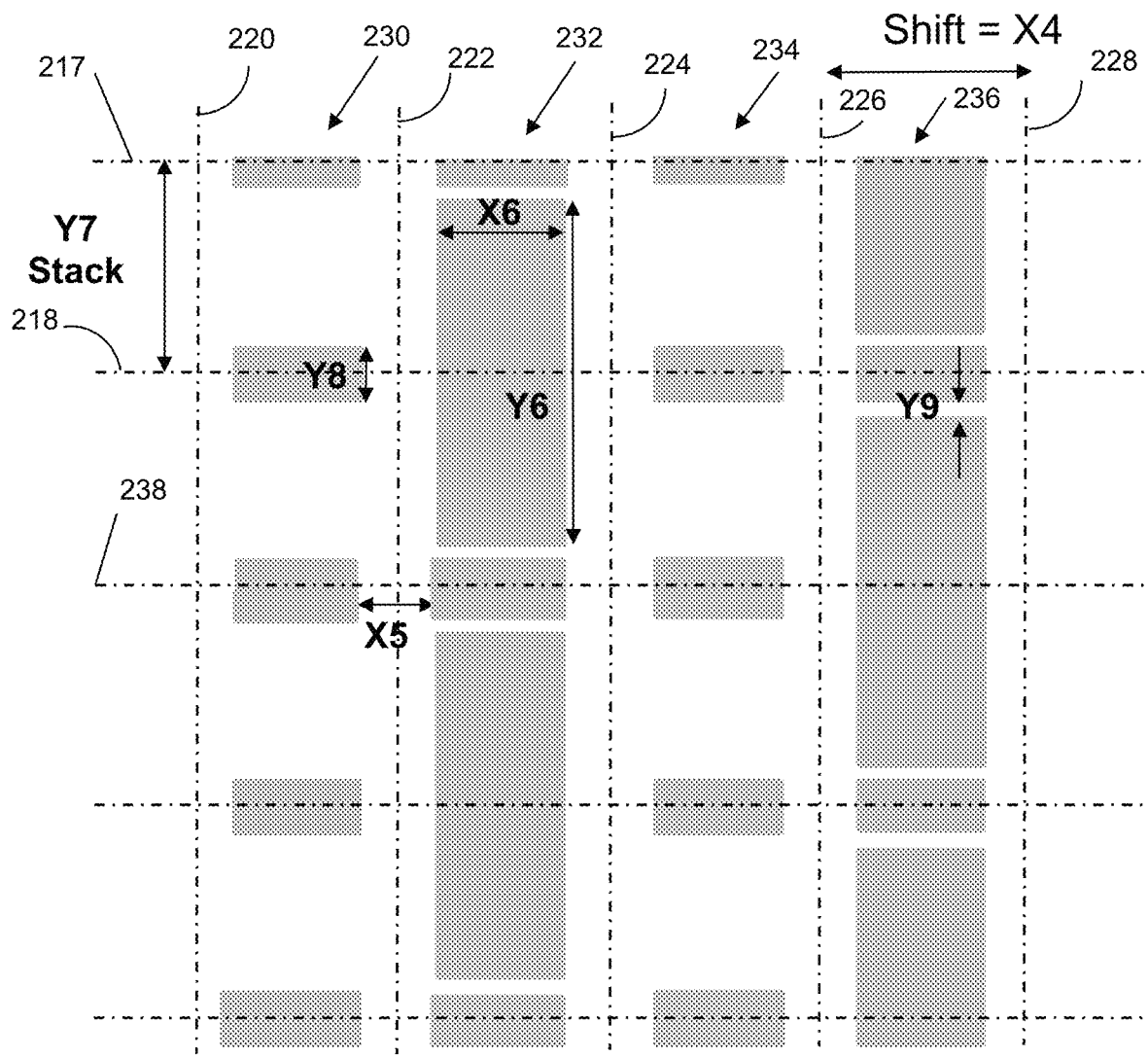
FIG. 2B illustrates "green" condition layers of electrodes to be formed for inclusion in the embodiment of FIG. 2A.

FIG. 2B illustrates electrode layer patterns in a green state positioned before cutting or dicing operation, but with various dotted lines represented such as would generate when assembled the capacitor 200. In particular, such cut lines are in regular rows and columns so as to form right angles at the intersections thereof. Sets of intersecting cut lines form electrodes to be stacked for formation of the subject capacitor subject matter. For example, dotted lines 217 and 218 both respectively cooperate and interact with each of respective right-angle intersecting cut lines 220, 222, 224, 226, and 228 so as to form sectioned layers 230, 232, 234, and 236, respectively. Similarly, cut lines 218 and 238 both respectively cooperate and interact with each of the respective right-angle intersecting cut lines 220, 222, 224, 226, and 228 so as to form sectioned layers which appear in FIG. 2B below each of 230, 232, 234, and 236, respectively.

It is to be further understood that sectioned layers 232 and 236 comprise respective complementary electrode patterns, for forming respective portions of capacitor 200.

Also, it will be understood that various dimensions regarding such green-state sectioned layers may be selected in order to result in desired design criteria of a resulting capacitor 200. For example, the "Shift" dimension X4 involved with printing of the green electrode layers and the "Stack" dimension Y7 involved therewith, help to define the overall dimensions of the green-state sectioned layers 230, 232, 234, and 236. As shown, the "Shift" dimension X4 equates to the distance between dotted lines 226 and 228 so as to define in one dimension the sectioned layer 236, while the "Stack" dimension Y7 equates to the distance between dotted lines 217 and 218 so as to define in the other dimension the sectioned layer 236. It is also understood by those of ordinary skill in the art that the green-state electrode layers are eventually once diced and assembled subjected to a curing or heat treatment process (such as firing), which results in well-known shrinkage of the involved materials. Different materials may have different shrinkage rates, all of which may be taken into account when selecting X4 and Y7 dimensions in order to achieve desired dimensions for capacitor 200. However, X4 may be about 0.0320" and Y7 may be about 0.0230".

Further, those of ordinary skill in the art understand that adjusting dimensions and positioning of the planar electrode elements in the respective sectioned layers can affect resulting characteristics of capacitor 200. For example, for such design reasons, the various other dimensions X5, X6, Y6, Y8, and Y9 may all be selected by users for particular embodiments in order to impart desired resulting characteristics of a device 200. However, X5 may be about 0.0110", X6 may be about 0.0150", Y6 may be about 0.0290", Y8 may be about 0.0110", and Y9 may be about 0.0030".

Figure 3:
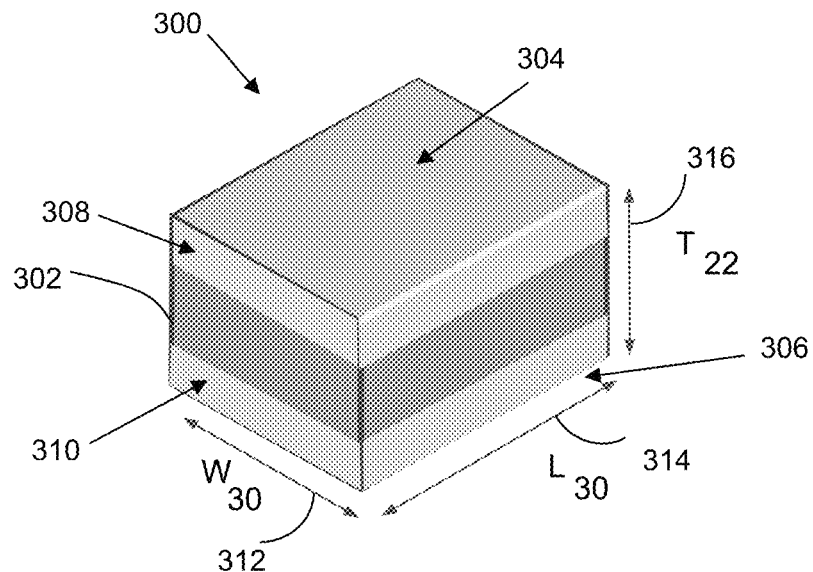
FIG. 3 illustrates a generally top and sides external perspective view of another embodiment of a capacitor in accordance with the present invention.

FIG. 3 illustrates a generally top and sides external perspective view of a yet another embodiment of a capacitor generally 300. As illustrated, the e capacitor 300 generally has a six-sided polyhedron body generally 302, with external top and bottom terminals respectively 304 and 306 (not seen). As shown, such external terminals present on a designated top or bottom but also overlap or wrap around a portion of the sides between the top and bottom, such as sides 308 and 310.

The width and length dimensions 312 and 314 are marked as "30" for reference to 30 mils. As understood by those of ordinary skill in the art, certain standard shapes or package sizes are normalized in the industry. The thickness or height "T" dimension 316 of capacitor 300 is represented as "22" for reference to 22 mils. The dimensions represented by the capacitor 300 of the presently disclosed subject matter in FIG. 1A would be generally referred to as an "0303", for a so-called low profile device. In particular, the package size illustrated may be representative of a size sometimes associated with a single layer capacitor (SLC). However, as with the embodiment of FIG. 1A and others, the presently disclosed subject matter preferably may comprise a plurality of layers of vertical electrodes, as further discussed herein.

Figure 4:
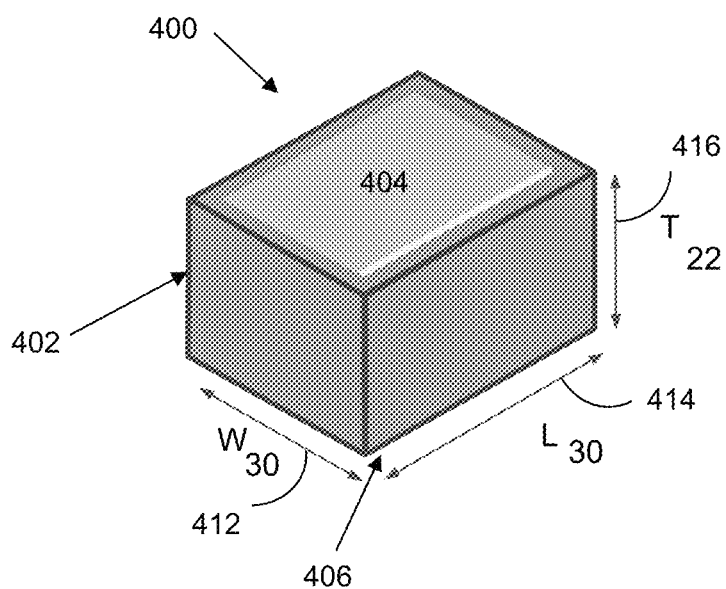
FIG. 4 illustrates a generally top and sides external perspective view of another embodiment of a capacitor in accordance with the present invention.

FIG. 4 illustrates a generally top and sides external perspective view of another embodiment of a capacitor generally 400. As illustrated, the capacitor 400 generally has a six-sided polyhedron body generally 402, with external top and bottom terminals respectively 404 and 406 (not seen). As shown and/or discussed, such external terminals are present on a designated top or bottom but do not also overlap or wrap around a portion of the sides between the top and bottom.

The width and length dimensions 412 and 414 are marked as "30" for reference to 30 mils. The thickness or height "T" dimension 416 of capacitor 400 is represented as "22" for reference to 22 mils. Similar to those of FIG. 3, the dimensions represented by the capacitor 400 of the presently disclosed subject matter in FIG. 4 would be generally referred to as an "0303", for a so-called low profile device. In particular, the package size illustrated may be representative of a size sometimes associated with a single layer capacitor (SLC). However, as with the embodiment of FIG. 3 and others, the presently disclosed subject matter of FIG. 4 preferably may comprise a plurality of layers of vertical electrodes, as further discussed herein.

Figure 7:
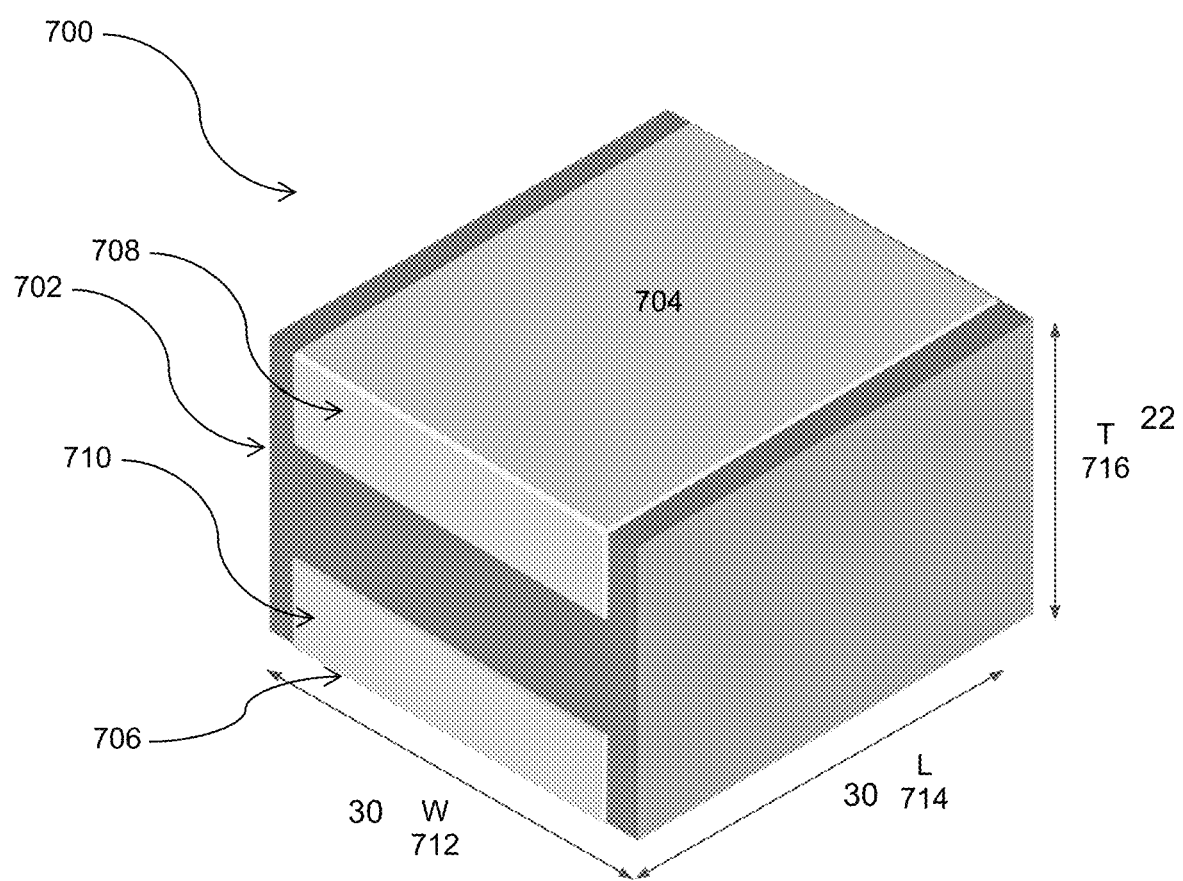
FIG. 7 illustrates a generally top and sides external perspective view of another embodiment of a capacitor in accordance with the present invention.

FIG. 7 illustrates a generally top and sides external perspective view of another embodiment of a capacitor generally 700. As illustrated, the capacitor 700 generally has a six-sided polyhedron body generally 702, with external top and bottom terminals respectively 704 and 706 (not seen). As shown and/or discussed, such external terminals are present on a designated top or bottom but also overlap or wrap around a portion of the sides between the top and bottom, such as sides 708 and 710.

The width and length dimensions 712 and 704 are marked as "30" for reference to 30 mils. The thickness or height "T" dimension 716 of capacitor 700 is represented as "22" for reference to 22 mils. Similar to those of FIGS. 3 and 4, the dimensions represented by the capacitor 700 of the presently disclosed subject matter in FIG. 7 would be generally referred to as an "0303", for a so-called low profile device. In particular, the package size illustrated may be representative of a size sometimes associated with a single layer capacitor (SLC). However, as with the embodiment of FIGS. 3 and 4 and others, the presently disclosed subject matter of FIG. 7 preferably may comprise a plurality of layers of vertical electrodes, as further discussed herein.

Those of ordinary skill in the art will understand from the complete disclosure herewith that green state electrode layer designs similar to those of application FIG. 1B may be used, with adjusted dimensions, in order to form the resulting device 300 hereof, while green state electrode layer designs similar to those of application FIG. 2B may be used, with adjusted dimensions, in order to form the resulting device 400 and/or 700 hereof.

FIGS. 5A-5D illustrate various views of electrodes as may be employed to produce a multilayer ceramic capacitor in accordance with present invention. Those of ordinary skill in the art, however, will appreciate that the exact number of cells provided depends on many variables including, for example, the target design value for the capacitor.

In accordance with one embodiment, a first pattern set of electrodes (e.g., FIG. 5B) corresponds to a first main electrode 500, with arm-like appendages (i.e., electrode arms or extension arms) 502, 504 positioned on either side of a central portion or main body 506. On the same plane, serving as both anchor tab and counter electrode is a second C-shaped electrode 508 having side arms 522, 524. In one embodiment, first main electrode 500 can be viewed as having an end or base portion 501 that extends to and is exposed along an entire dimension of a surface of an unterminated stack of dielectric and electrode layers. The central portion 506 and extension arms 502, 504 of first main electrode 500 all extend from different locations along the end portion 501 in a manner such that central portion 506 and extension arms 502, 504 are all generally parallel to one another. Respective sides of the extension arms 502 and 504 may also extend to and be exposed along respective surfaces adjacent to the surface at which end portion 501 is exposed. Second C-shaped electrode 508 also has an end portion that extends to and is exposed along an entire surface of an unterminated stack of dielectric and electrode layers. The side arms 522, 524 extend from such end portion of second C-shaped electrode 508 and have portions that extend to and are exposed along respective surfaces adjacent to the surface at which the end portion of second C-shaped electrode 508 is exposed.

The second pattern set of electrodes (e.g., FIG. 5C) has a similar, mirrored, structure, where first main electrode 510 includes extension arms 512, 514 positioned on either side of central portion 516. Central portion 516 and extension arms 512, 514 all generally extend parallel to one another from an end portion 511. On the same plane, serving as both anchor tab and counter electrode is a second C-shaped electrode 518 having side arms 526, 528. As described above relative to first main electrode 500 and second C-shaped electrode 508, the first main electrode 510 and second C-shaped electrode 518 may be viewed as having end or base portions from which central portions and/or side arm portions extend.

Figure 5A:
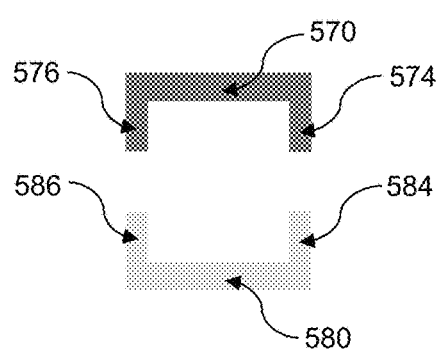
FIGS. 5A-5E illustrate one embodiment of the internal electrode sheets of the present invention.

A view of an internal electrode sheet containing anchor/dummy electrodes is illustrated in FIG. 5A. In the particular embodiment shown in FIG. 5A, each counter electrode 570 may be generally C-shaped to include an end portion 572 from which respective extension arms 574 and 576 extend in a substantially parallel relationship to one another. Each counter electrode 580 may also be generally C-shaped to include an end portion 582 from which respective extension arms 584 and 586 extend in a generally parallel relationship to one another. In a given third electrode sheet, counter electrodes 570 and 580 are formed in substantially the same plane. Extension arm 574 of counter electrode 570 is substantially longitudinally aligned with extension arm 584 of counter electrode 580, and extension arm 576 of counter electrode 570 is substantially longitudinally aligned with extension arm 586 of counter electrode 580.

Figure 5B:
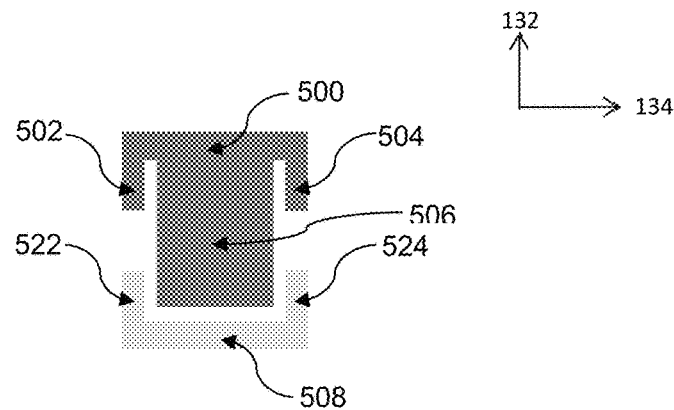
Figure 5C:
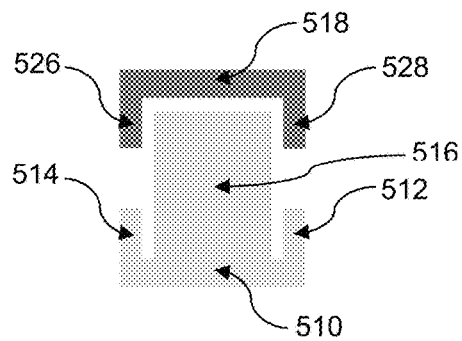
Figure 5D:
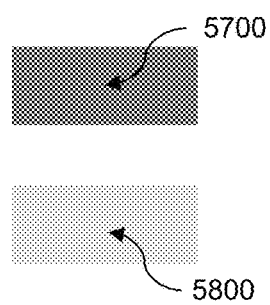

Another view of an internal electrode sheet containing shield electrodes is illustrated in FIG. 5D. In the particular embodiment shown in FIG. 5D, each counter electrode 5700 may be generally rectangular and each counter electrode 5800 may also be generally rectangular. In a given fourth electrode sheet, counter electrodes 5700 and 5800 are formed in substantially the same plane.

Figure 5E:
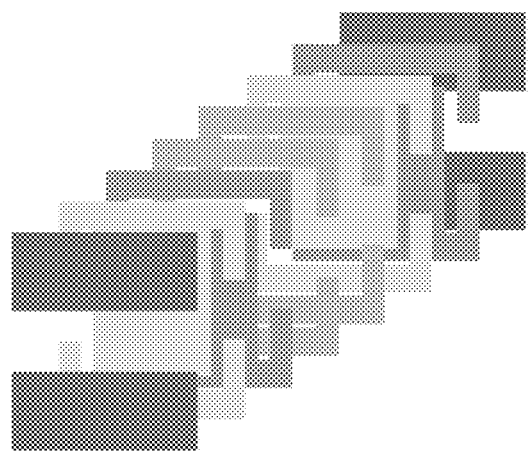

When the electrode layers illustrated in FIGS. 5A-5D are stacked, they may be stacked as illustrated in the arrangement of FIG. 5E. First and second sheets of electrodes (each first sheet consisting of a first main electrode 500 and second C-shaped electrode 508, and each second sheet consisting of a first main electrode 510 and second C-shaped electrode 518) are alternately stacked with dielectric layers (not shown) to form a multi-layered structure. Also included are the anchor/dummy electrodes and the shield electrodes.

In one embodiment, the active electrodes of FIGS. 5B and 5C may be employed such that their longitudinal length is substantially the same as the longitudinal length of the capacitor. In such embodiment, the electrodes may be employed in forming wrap around external terminals. However, as indicated herein, in one embodiment, the active electrodes of FIGS. 5B and 5C may be employed such that their longitudinal length is less than the longitudinal length of the capacitor. In such embodiment, the electrodes may be employed in forming external terminals only on the top surface and the bottom surface and thus not forming wrap around external terminals.

In one embodiment, the internal electrode sheets may not include extension arms. In the embodiment as illustrated in FIGS. 6A-6D, the internal electrode sheets may include electrodes provided in generally rectangular configurations. In accordance with one embodiment, a first pattern set of electrodes (FIG. 6B) corresponds to a first main electrode 600 with a central portion 606. On the same plane, serving as both anchor tab and counter electrode is a second end electrode 608. In one embodiment, first main electrode 600 can be viewed as having an end portion 601 that extends to and is exposed along at least part of a dimension of a surface of an unterminated stack of dielectric and electrode layers. The counter electrode 608 has an end portion that extends to and is exposed along at least part of a surface of an unterminated stack of dielectric and electrode layers. In one embodiment, the first main electrode 600 and the counter electrode 608 do not extend along and/or are not exposed along the entire surface of an unterminated stack of dielectric and electrode layers.

The second pattern set of electrodes (e.g., FIG. 6C) has a similar, mirrored, structure, where first main electrode 610 includes a central portion 616. On the same plane, serving as both anchor tab and counter electrode is a second end electrode 618. In one embodiment, first main electrode 610 can be viewed as having an end portion 611 that extends to and is exposed along at least part of a dimension of a surface of an unterminated stack of dielectric and electrode layers. The counter electrode 618 has an end portion that extends to and is exposed along at least part of a surface of an unterminated stack of dielectric and electrode layers. In one embodiment, the first main electrode 610 and the counter electrode 618 do not extend along and/or are not exposed along the entire surface of an unterminated stack of dielectric and electrode layers.

Figure 6A:
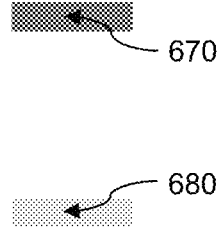
FIGS. 6A-6D illustrate another embodiment of the internal electrode sheets of the present invention.

A view of an internal electrode sheet containing anchor/dummy electrodes is illustrated in FIG. 6A. In the particular embodiment shown in FIG. 6A, each counter electrode 670 may be of a generally rectangular configuration and may not contain any extension arms. Each counter electrode 680 may also be of a generally rectangular configuration and may not contain any extension arms.

Figure 6B:
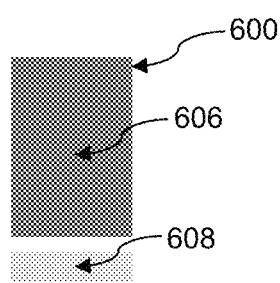
Figure 6C:
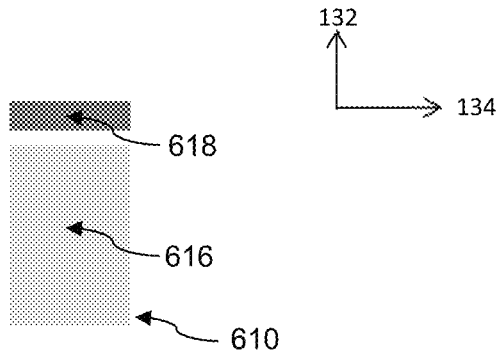
Figure 6D:
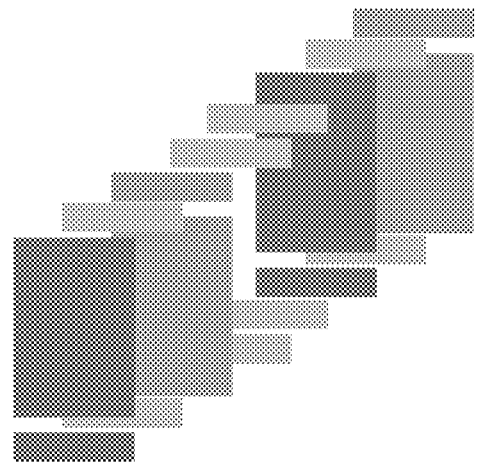

When the electrode layers illustrated in FIGS. 6A-6C are stacked, they may be stacked as illustrated in the arrangement of FIG. 6D. First and second sheets of electrodes (each first sheet consisting of a first main electrode 600 and second counter electrode 608, and each second sheet consisting of a first main electrode 610 and second counter electrode 618) are alternately stacked with dielectric layers (not shown) to form a multi-layered structure. Also included are the anchor/dummy electrodes.

In addition to the above, other internal electrode designs are described in U.S. Pat. No. 8,446,705 to Ritter et al., which is incorporated herein by reference in its entirety for all purposes. For instance, additional electrode designs may include a variation wherein instead of a C-shaped counter electrode, an L-shaped counter electrode is employed and the main electrode includes a single extension arm.

In one embodiment, the internal electrode sheets are configured to generate multiple capacitive elements. Without intending to be limited, it is believed that creating plural capacitive elements within a single set of stacked electrodes allows for an increase in efficiency and is less expensive than other approaches.

For instance, in the embodiment of FIGS. 5A-5D, at least four groups of capacitive areas are formed. The primary capacitance area arises from overlap of the central portions 506, 516 of first main electrodes 500, 510 of the respective electrode layers. Each set of opposing first electrodes of opposing electrode layers contributes to the first primary capacitance 526. A secondary capacitance area arises from coupling between C-shaped electrode 518 of a first polarity and the adjacent portions of main electrode 510, which has an opposite polarity to that of C-shaped electrode 518. A tertiary capacitance arises from the areas of coupling between side arms 528 and 514 and between side arms 526 and 512. A quaternary capacitance arises from the specific area of coupling between the end of central portion 516 of main electrode 510 and the end portion of C-shaped electrode 518.

Once a selected configuration of electrodes and dielectric material are stacked together, an unterminated six-sided device is formed. Exposed edges of the electrodes along a top surface are aligned while exposed edges of the electrodes along a bottom surface are aligned thereby allowing for formation of the external terminals in order to connect electrode plates of a given polarity together.

In one embodiment, a first external terminal is electrically connected to each first main electrode of a first electrode layer and each second counter electrode of a second electrode layer and a second external terminal is electrically connected to each first main electrode of a second electrode layer and each second counter electrode or a first electrode layer.

In one embodiment, the external terminals are formed on the top surface and the bottom surface. In another embodiment, the external terminals are formed only on the top surface and the bottom surface. In another embodiment, the external terminals are formed on the top surface and the bottom surface and extend to at least one side surface, such as at least two side surfaces, such as at least four side surfaces.

In one embodiment, the external terminals are formed such that the external terminals extend along an entire dimension of a bottom surface and a top surface. In one embodiment, the external terminals may also extend at least part of a dimension of a side surface. In another embodiment, the external terminals do not extend the entire dimension of at least one of the width or length of a bottom surface or a top surface. In another embodiment, the external terminals do not extend the entire dimension of the width and length of a bottom surface or a top surface.

In general, the present invention provides a multilayer capacitor with an electrode having a unique configuration that provides various benefits and advantages. In this regard, it should be understood that the materials employed in constructing the capacitor may not be limited and may be any as generally employed in the art and formed using any method generally employed in the art.

In general, the dielectric layers are typically formed from a material having a relatively high dielectric constant (K), such as from about 10 to about 40,000 in some embodiments from about 50 to about 30,000, and in some embodiments, from about 100 to about 20,000.

In this regard, the dielectric material may be a ceramic. The ceramic may be provided in a variety of forms, such as a wafer (e.g., pre-fired) or a dielectric material that is co-fired within the device itself.

Particular examples of the type of high dielectric material include, for instance, NPO(COG) (up to about 100), X7R (from about 3,000 to about 7,000), X7S, Z5U, and/or Y5V materials. It should be appreciated that the aforementioned materials are described by their industry-accepted definitions, some of which are standard classifications established by the Electronic Industries Alliance (EIA), and as such should be recognized by one of ordinary skill in the art. For instance, such material may include a ceramic. Such materials may include a pervoskite, such as barium titanate and related solid solutions (e.g., barium-strontium titanate, barium calcium titanate, barium zirconate titanate, barium strontium zirconate titanate, barium calcium zirconate titanate, etc.), lead titanate and related solid solutions (e.g., lead zirconate titanate, lead lanthanum zirconate titanate), sodium bismuth titanate, and so forth. In one particular embodiment, for instance, barium strontium titanate ("BSTO") of the formula $Ba_xSr_{1-x}TiO_3$ may be employed, wherein x is from 0 to 1, in some embodiments from about 0.15 to about 0.65, and in some embodiments, from about from 0.25 to about 0.6. Other suitable perovskites may include, for instance, $Ba_xCa_{1-x}TiO_3$ where x is from about 0.2 to about 0.8, and in some embodiments, from about 0.4 to about 0.6, $Pb_xZr_{1-x}TiO_3$ ("PZT") where x ranges from about 0.05 to about 0.4, lead lanthanum zirconium titanate ("PLZT"), lead titanate ($PbTiO_3$), barium calcium zirconium titanate ($BaCaZrTiO_3$), sodium nitrate ($NaNO_3$), $KNbO_3$, $LiNbO_3$, $LiTaO_3$, $PbNb_2O_6$, $PbTa_2O_6$, $KSr(NbO_3)$ and $NaBa_2(NbO_3)_5KHb_2PO_4$. Still additional complex perovskites may include $A[B_{1/3}B_{2/3}]O_3$ materials, where A is $BaxSr_{1-x}$ (x can be a value from 0 to 1); B1 is $Mg_yZn_{1-y}$ (y can be a value from 0 to 1); B2 is $Ta_zNb_{1-z}$ (z can be a value from 0 to 1). In one particular embodiment, the dielectric layers may comprise a titanate.

The electrode layers may be formed from any of a variety of different metals as is known in the art. The electrode layers may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. Sputtered titanium/tungsten (Ti/W) alloys, as well as respective sputtered layers of chrome, nickel and gold, may also be suitable. The electrodes may also be made of a low resistive material, such as silver, copper, gold, aluminum, palladium, etc. In one particular embodiment, the electrode layers may comprise nickel or an alloy thereof.

External terminals may be formed from any of a variety of different metals as is known in the art. The external terminals may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. In one particular embodiment, the external terminals may comprise copper or an alloy thereof.

The external terminals can be formed using any method generally known in the art. The external terminals may be formed using techniques such as sputtering, painting, printing, electroless plating or fine copper termination (FCT), electroplating, plasma deposition, propellant spray/air brushing, and so forth.

In one embodiment, the external terminals may be formed such that the external terminals are relatively thick. For instance, such terminals may be formed by applying a thick film stripe of a metal to exposed portions of electrode layers. Such metal may be in a glass matrix and may include silver or copper. As an example, such strip may be printed and fired onto the capacitor. Thereafter, additional plating layers of metal (e.g., nickel, tin, solder, etc.) may be created over the termination strips such that the capacitor is solderable to a substrate. Such application of thick film stripes may be conducted using any method generally known in the art (e.g., by a termination machine and printing wheel for transferring a metal-loaded paste over the exposed electrode layers). Examples of components with external terminals formed by baked terminations and metal films plated thereon are disclosed in U.S. Pat. No. 5,021,921 to Sano et al., which is incorporated by reference herein for all purposes.

The thick-plated external terminals may have an average thickness of about 150 μm or less, such as about 125 μm or less, such as about 100 μm or less, such as about 80 μm or less. The thick-plated external terminals may have an average thickness of about 25 μm or more, such as about 35 μm or more, such as about 50 μm or more, such as about 75 or more μm. For instance, the thick-plated external terminals may have an average thickness of from about 25 μm to about 150 μm, such as from about 35 μm to about 125 μm, such as from about 50 μm to about 100 μm.

In another embodiment, the external terminals may be formed such that the external terminal is a thin-film plating of a metal. Such thin-film plating can be formed by depositing a conductive material, such as a conductive metal, on an exposed portion of an electrode layer. For instance, a leading edge of an electrode layer may be exposed such that it may allow for the formation of a plated termination.

The thin-plated external terminals may have an average thickness of about 50 μm or less, such as about 40 μm or less, such as about 30 μm or less, such as about 25 μm or less. The thin-plated external terminals may have an average thickness of about 5 μm or more, such as about 10 μm or more, such as about 15 μm or more. For instance, the external terminals may have an average thickness of from about 5 μm to about 50 μm, such as from about 10 μm to about 40 μm, such as from about 15 μm to about 30 μm, such as from about 15 μm to about 25 μm.

In general, the external terminal may comprise a plated terminal. For instance, the external terminal may comprise an electroplated terminal, an electroless plated terminal, or a combination thereof. For instance, an electroplated terminal may be formed via electrolytic plating. An electroless plated terminal may be formed via electroless plating.

When multiple layers constitute the external terminal, the external terminal may include an electroplated terminal and an electroless plated terminal. For instance, electroless plating may first be employed to deposit an initial layer of material. The plating technique may then be switched to an electrochemical plating system which may allow for a faster buildup of material.

When forming the plated terminals with either plating method, a leading edge of the lead tabs of the electrode layers that is exposed from the main body of the capacitor is subjected to a plating solution. By subjecting, in one embodiment, the capacitor may be dipped into the plating solution.

The plating solution contains a conductive material, such as a conductive metal, is employed to form the plated termination. Such conductive material may be any of the aforementioned materials or any as generally known in the art. For instance, the plating solution may be a nickel sulfamate bath solution or other nickel solution such that the plated layer and external terminal comprise nickel. Alternatively, the plating solution may be a copper acid bath or other suitable copper solution such that the plated layer and external terminal comprise copper.

Additionally, it should be understood that the plating solution may comprise other additives as generally known in the art. For instance, the additives may include other organic additives and media that can assist in the plating process. Additionally, additives may be employed in order to employ the plating solution at a desired pH. In one embodiment, resistance-reducing additives may be employed in the solutions to assist with complete plating coverage and bonding of the plating materials to the capacitor and exposed leading edges of the lead tabs.

The capacitor may be exposed, submersed, or dipped in the plating solution for a predetermined amount of time. Such exposure time is not necessarily limited but may be for a sufficient amount of time to allow for enough plating material to deposit in order to form the plated terminal. In this regard, the time should be sufficient for allowing the formation of a continuous connection among the desired exposed, adjacent leading edges of lead tabs of a given polarity of the respective electrode layers within a set of alternating dielectric layers and electrode layers.

In general, the difference between electrolytic plating and electroless plating is that electrolytic plating employs an electrical bias, such as by using an external power supply. The electrolytic plating solution may be subjected typically to a high current density range, for example, ten to fifteen amp/ft$^2$ (rated at 9.4 volts). A connection may be formed with a negative connection to the capacitor requiring formation of the plated terminals and a positive connection to a solid material (e.g., Cu in Cu plating solution) in the same plating solution. That is, the capacitor is biased to a polarity opposite that of the plating solution. Using such method, the conductive material of the plating solution is attracted to the metal of the exposed leading edge of the lead tabs of the electrode layers.

Prior to submersing or subjecting the capacitor to a plating solution, various pretreatment steps may be employed. Such steps may be conducted for a variety of purposes, including to catalyze, to accelerate, and/or to improve the adhesion of the plating materials to the leading edges of the lead tabs.

Additionally, prior to plating or any other pretreatment steps, an initial cleaning step may be employed. Such step may be employed to remove any oxide buildup that forms on the exposed lead tabs of the electrode layers. This cleaning step may be particularly helpful to assist in removing any buildup of nickel oxide when the internal electrodes or other conductive elements are formed of nickel. Component cleaning may be effected by full immersion in a preclean bath, such as one including an acid cleaner. In one embodiment, exposure may be for a predetermined time, such as on the order of about 10 minutes. Cleaning may also alternatively be effected by chemical polishing or harperizing steps.

In addition, a step to activate the exposed metallic leading edges of the lead tabs of the electrode layers may be performed to facilitate depositing of the conductive materials. Activation can be achieved by immersion in palladium salts, photo patterned palladium organometallic precursors (via mask or laser), screen printed or ink-jet deposited palladium compounds or electrophoretic palladium deposition. It should be appreciated that palladium-based activation is presently disclosed merely as an example of activation solutions that often work well with activation for exposed tab portions formed of nickel or an alloy thereof. However, it should be understood that other activation solutions may also be utilized.

Also, in lieu of or in addition to the aforementioned activation step, the activation dopant may be introduced into the conductive material when forming the electrode layers of the capacitor. For instance, when the electrode layer comprises nickel and the activation dopant comprises palladium, the palladium dopant may be introduced into the nickel ink or composition that forms the electrode layers. Doing so may eliminate the palladium activation step. It should be further appreciated that some of the above activation methods, such as organometallic precursors, also lend themselves to co-deposition of glass formers for increased adhesion to the generally ceramic body of the capacitor. When activation steps are taken as described above, traces of the activator material may often remain at the exposed conductive portions before and after termination plating.

Additionally, post-treatment steps after plating may also be employed. Such steps may be conducted for a variety of purposes, including enhancing and/or improving adhesion of the materials. For instance, a heating (or annealing) step may be employed after performing the plating step. Such heating may be conducted via baking, laser subjection, UV exposure, microwave exposure, arc welding, etc.

As indicated herein, the external terminal includes at least one plating layer. In one embodiment, the external terminal may comprise only one plating layer. However, it should be understood that the external terminals may comprise a plurality of plating layers. For instance, the external terminals may comprise a first plating layer and a second plating layer. In addition, the external terminals may also comprise a third plating layer. The materials of these plating layers may be any of the aforementioned and as generally known in the art.

For instance, one plating layer, such as a first plating layer, may comprise copper or an alloy thereof. Another plating layer, such as a second plating layer, may comprise nickel or an alloy thereof. Another plating layer, such as a third plating layer, may comprise tin, lead, gold, or a combination, such as an alloy. Alternatively, an initial plating layer may include nickel, following by plating layers of tin or gold. In another embodiment, an initial plating layer of copper may be formed and then a nickel layer.

In one embodiment, initial or first plating layer may be a conductive metal (e.g., copper). This area may then be covered with a second layer containing a resistor-polymeric material for sealing. The area may then be polished to selectively remove resistive polymeric material and then plated again with a third layer containing a conductive, metallic material (e.g., copper).

The aforementioned second layer above the initial plating layer may correspond to a solder barrier layer, for example a nickel-solder barrier layer. In some embodiments, the aforementioned layer may be formed by electroplating an additional layer of metal (e.g., nickel) on top of an initial electrolessly or electrolytically plated layer (e.g., plated copper). Other exemplary materials for layer the aforementioned solder barrier layer include nickel-phosphorus, gold, and silver. A third layer on the aforementioned solder-barrier layer may in some embodiments correspond to a conductive layer, such as plated Ni, Ni/Cr, Ag, Pd, Sn, Pb/Sn or other suitable plated solder.

In addition, a layer of metallic plating may be formed followed by an electroplating step to provide a resistive alloy or a higher resistance metal alloy coating, for example, electroless Ni—P alloy over such metallic plating. It should be understood, however, that it is possible to include any metal coating as those of ordinary skill in the art will understand from the complete disclosure herewith.

It should be appreciated that any of the aforementioned steps can occur as a bulk process, such as a barrel plating, fluidized bed plating and/or flow-through plating termination processes, all of which are generally known in the art. Such bulk processes enable multiple components to be processed at once, providing an efficient and expeditious termination process. This is a particular advantage relative to conventional termination methods, such as the printing of thick-film terminations that require individual component processing.

As described herein, the formation of the external terminals is generally guided by the position of the exposed leading edges of the lead tabs of the electrode layers. Such phenomena may be referred to as "self-determining" because the formation of the external plated terminals is determined by the configuration of the exposed conductive metal of the electrode layers at the selected peripheral locations on the capacitor.

Additional aspects of the above-described technology for forming thin-film plated terminations are described in U.S. Pat. Nos. 7,177,137 and 7,463,474 to Ritter et al., which are incorporated by reference herein for all purposes. It should be appreciated that additional technologies for forming capacitor terminals may also be within the scope of the present technology. Exemplary alternatives include, but are not limited to, formation of terminations by plating, magnetism, masking, electrophoretics/electrostatics, sputtering, vacuum deposition, printing or other techniques for forming both thick-film or thin-film conductive layers.

The multilayer ceramic capacitor can be employed in a device, such as an electronic device. The device may comprise an integrated circuit. In one embodiment, the multilayer ceramic capacitor may be connected to the integrated circuit or a component of the integrated circuit using a bond wire. For instance, the wire may be a copper wire or a gold wire. The wire can be bonded using general wire-bonding techniques.

The multilayer ceramic capacitors of the present invention may be employed in various applications. For instance, the capacitors may be employed for optical and microwave applications.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

The invention claimed is:

1. A multilayer ceramic capacitor comprising:
a top surface and an opposing bottom surface and four side surfaces that extend between the top surface and the bottom surface,
a main body formed from a plurality of dielectric layers and a plurality of internal electrode layers alternately arranged,
external terminals electrically connected to the internal electrode layers wherein a first external terminal is disposed along the top surface and a second external terminal is disposed along the bottom surface,
wherein the internal electrode layer includes a first electrode electrically connected to the first external terminal and a second counter electrode electrically connected to the second external terminal, wherein the first electrode includes a central portion extending from the first external terminal toward the second external terminal and wherein the central portion extends 40% to less than 100% a distance in a longitudinal direction from the first external terminal to the second external terminal, wherein the second counter electrode extends from 5% to 50% the distance in the longitudinal direction from the first external terminal to the second external terminal, wherein a gap is present between the central portion of the first electrode and the second counter electrode and wherein the gap is from 2% to 40% the distance in the longitudinal direction from the first external terminal to the second external terminal.

2. The multilayer ceramic capacitor according to claim 1, wherein the central portion extends 50% to less than 100% the distance in the longitudinal direction from the first external terminal to the second external terminal.

3. The multilayer ceramic capacitor according to claim 1, wherein the gap is from 2% to 30% the distance in the longitudinal direction from the first external terminal to the second external terminal.

4. The multilayer ceramic capacitor according to claim 1, wherein the gap is from 5% to 40% of a length of the central portion of the first electrode in the longitudinal direction.

5. The multilayer ceramic capacitor according to claim 1, wherein the second counter electrode extends from 5% to 40% the distance in the longitudinal direction from the first external terminal to the second external terminal.

6. The multilayer ceramic capacitor according to claim 1, wherein the first electrode includes an end portion and at least one extension arm extending from the end portion.

7. The multilayer ceramic capacitor according to claim 1, wherein the second counter electrode includes an end portion and at least one extension arm extending from the end portion.

8. The multilayer ceramic capacitor according to claim 1, wherein the first electrode does not include an extension arm.

9. The multilayer ceramic capacitor according to claim 1, wherein the first electrode is of a generally rectangular configuration.

10. The multilayer ceramic capacitor according to claim 1, wherein the second counter electrode does not include an extension arm.

11. The multilayer ceramic capacitor according to claim 1, wherein the second counter electrode is of a generally rectangular configuration.

12. The multilayer ceramic capacitor according to claim 1, wherein the first electrode has a longitudinal edge extending between respective side surfaces and wherein a length of the longitudinal edge is substantially the same as a length from the respective side surfaces.

13. The multilayer ceramic capacitor according to claim 1, wherein the first electrode has a longitudinal edge extending between respective side surfaces and wherein a length of the longitudinal edge is less than a length from the respective side surfaces.

14. The multilayer ceramic capacitor according to claim 1, wherein the first electrode has a longitudinal edge extending between respective side surfaces and wherein a length of the longitudinal edge is from 40% to 95% a length from the respective side surfaces.

15. The multilayer ceramic capacitor according to claim 1, wherein the external terminals are formed only on the top surface and the bottom surface of the capacitor.

16. The multilayer ceramic capacitor according to claim 1, wherein the external terminals are formed on the top surface and the bottom surface and wrap around to at least one side surface of the capacitor.

17. The multilayer ceramic capacitor according to claim 16, wherein the external terminals wrap around to only two side surfaces of the capacitor.

18. The multilayer ceramic capacitor according to claim 16, wherein the external terminals wrap around to all four side surfaces of the capacitor.

19. The multilayer ceramic capacitor according to claim 1, wherein the external terminals are formed by electroless plating.

20. The multilayer ceramic capacitor according to claim 1, wherein the external terminals are formed by electrolytic plating.

21. A device containing the multilayer ceramic capacitor of claim 1.

22. The device of claim 21, wherein the device comprises an integrated circuit.

23. The device of claim 22, wherein the multilayer ceramic capacitor is connected to the integrated circuit using a bond wire.

* * * * *